US009704785B2

(12) United States Patent
Hsieh et al.

(10) Patent No.: US 9,704,785 B2
(45) Date of Patent: Jul. 11, 2017

(54) SEMICONDUCTOR PACKAGE WITH DIE PADDLE

(71) Applicant: MediaTek Inc., Hsin-Chu (TW)

(72) Inventors: Tung-Hsien Hsieh, Zhubei (TW); Yi-Hui Lee, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/861,423

(22) Filed: Sep. 22, 2015

(65) Prior Publication Data
US 2016/0204053 A1  Jul. 14, 2016

Related U.S. Application Data

(60) Provisional application No. 62/103,171, filed on Jan. 14, 2015.

(51) Int. Cl.
| | | |
|---|---|---|
| *H01L 23/02* | (2006.01) | |
| *H01L 23/495* | (2006.01) | |
| *H05K 1/02* | (2006.01) | |
| *H01L 23/31* | (2006.01) | |
| *H01L 23/00* | (2006.01) | |

(52) U.S. Cl.
CPC .... *H01L 23/49503* (2013.01); *H01L 23/3121* (2013.01); *H01L 23/49541* (2013.01); *H01L 23/49548* (2013.01); *H01L 23/49558* (2013.01); *H05K 1/0215* (2013.01); *H01L 24/06* (2013.01); *H01L 24/32* (2013.01); *H01L 24/48* (2013.01); *H01L 24/73* (2013.01); *H01L 2224/04042* (2013.01); *H01L 2224/05554* (2013.01); *H01L 2224/06135* (2013.01); *H01L 2224/32245* (2013.01); *H01L 2224/48091* (2013.01); *H01L 2224/48247* (2013.01); *H01L 2224/73265* (2013.01); *H01L 2924/00014* (2013.01);

(Continued)

(58) Field of Classification Search
CPC .................... H01L 23/49503; H01L 23/49558
USPC ......................................................... 257/676
See application file for complete search history.

(56) References Cited

U.S. PATENT DOCUMENTS

| | | | | |
|---|---|---|---|---|
| 7,875,963 | B1 * | 1/2011 | Kim ................. | H01L 23/49503 257/666 |
| 9,299,646 | B1 * | 3/2016 | Kumar ............. | H01L 23/49541 |

(Continued)

FOREIGN PATENT DOCUMENTS

| | | |
|---|---|---|
| TW | 396565 | 7/2000 |
| TW | 200629488 | 8/2006 |
| TW | 200741924 | 11/2007 |

OTHER PUBLICATIONS

"Peddle" Merriam-Webster Online Dictionary. 2016, http://www.merriam-webster.com (Sep. 2, 2016).*

*Primary Examiner* — Jami M Valentine
(74) *Attorney, Agent, or Firm* — McClure, Qualey & Rodack, LLP

(57) ABSTRACT

The invention provides a semiconductor package. The semiconductor package includes a lead frame including a die paddle. A supporting bar connects to the die paddle, extending in an outward direction from the die paddle. At least two power leads are separated from the die paddle and the supporting bar, having first terminals close to the die paddle and second terminals extending outward from the die paddle. A power bar connects to the at least two power leads, having a supporting portion. A molding material encapsulates the lead frame leaving the supporting portion exposed.

27 Claims, 3 Drawing Sheets

(52) U.S. Cl.
CPC *H01L 2924/1421* (2013.01); *H01L 2924/181* (2013.01); *H01L 2924/3025* (2013.01)

(56) References Cited

U.S. PATENT DOCUMENTS

| | | |
|---|---|---|
| 2005/0006735 A1 | 1/2005 | an Tatt et al. |
| 2007/0215990 A1 | 9/2007 | San Antonio et al. |
| 2009/0166842 A1 | 7/2009 | Lee |

\* cited by examiner

US 9,704,785 B2

SEMICONDUCTOR PACKAGE WITH DIE PADDLE

CROSS REFERENCE TO RELATED APPLICATIONS

This application claims the benefit of U.S. Provisional Application No. 62/103,171 filed Jan. 14, 2015, the entirety of which is incorporated by reference herein.

BACKGROUND OF THE INVENTION

Field of the Invention

The present invention relates to a semiconductor package, and in particular to a lead frame design for a semiconductor package.

Description of the Related Art

For semiconductor die package design, an increased amount of input/output connections for multi-functional dies is required. A lead frame provides a solution for a semiconductor die package with mechanical support to the semiconductor die during its assembly into a finished product. The lead frame is normally fabricated from a metal sheet and is shaped by a stamping or etching process. For a conventional lead frame-based semiconductor package, however, the amount of leads for input/output connections of a semiconductor die are limited.

Thus, a novel semiconductor package is desirable.

BRIEF SUMMARY OF THE INVENTION

A semiconductor package is provided. An exemplary embodiment of a semiconductor package includes a lead frame including a die paddle. A supporting bar connects to the die paddle, extending in an outward direction from the die paddle. At least two power leads are separated from the die paddle and the supporting bar, having first terminals close to the die paddle and second terminals extending outward from the die paddle. A power bar connects to the at least two power leads, having a supporting portion. A molding material encapsulates the lead frame leaving the supporting portion exposed.

Another exemplary embodiment of a semiconductor package includes a lead frame including a die paddle. A supporting bar is electrically connected to the die paddle, extending in an outward direction from the die paddle. At least two power leads are separated from the die paddle and the supporting bar, having first terminals close to the die paddle and second terminals extending outward from the die paddle. A power bar connects to the power leads. The power bar comprises a supporting portion. The thickness of the supporting portion of the power bar is greater than that of the first terminals.

Yet another exemplary embodiment of a semiconductor package includes a lead frame including a die paddle. A supporting bar is electrically connected to the die paddle, extending in an outward direction from the die paddle. At least two power leads are separated from the die paddle and the supporting bar. A power bar having a terminal portion is in contact with the first terminal of one of the power leads and a supporting portion that is free from in contact with any of the at power leads. The thickness of the supporting portion is greater than that of a terminal portion.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
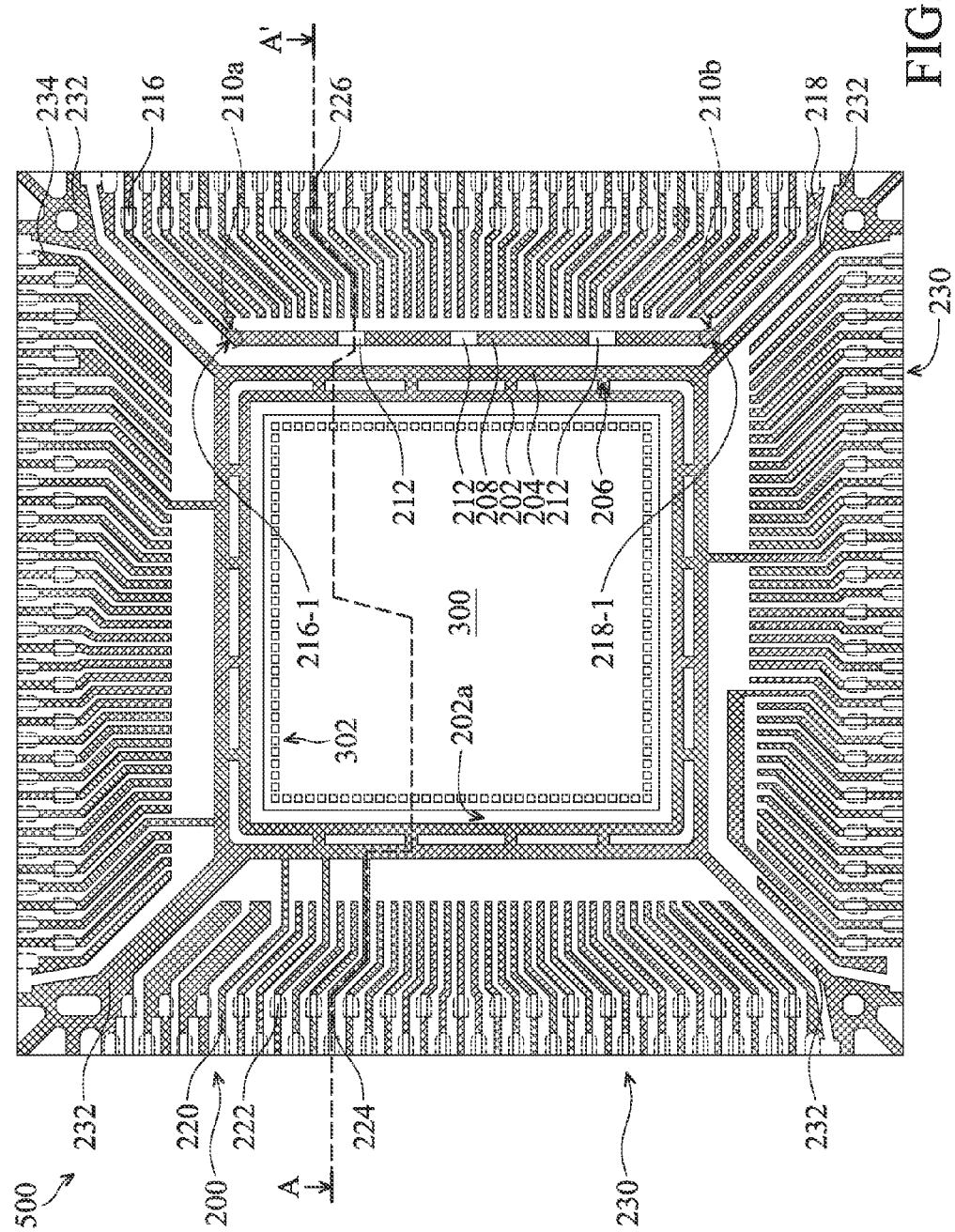
FIG. 1A is a top view of a semiconductor package in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a semiconductor package. A lead frame of the semiconductor package includes a power bar connecting at least two power leads to provide the same voltage for a semiconductor die mounted thereon. The power bar includes a terminal portion in contact with the power lead and a supporting portion that is free from in contact with the power lead. The thickness of the supporting portion is designed to be greater than that of the terminal portion. Therefore, the supporting portion with a thick thickness can enhance the mechanical strength and avoid the problem of dangling.

Figure 1B:
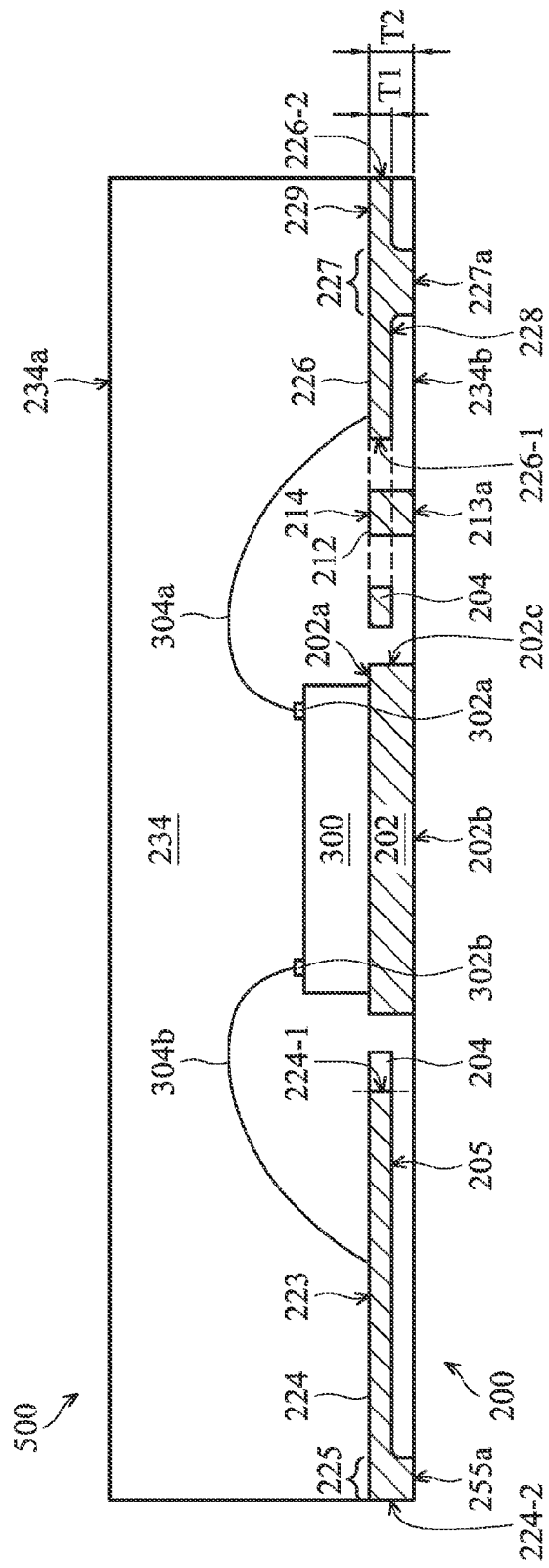
FIG. 1B is a cross-sectional view taken along the line A-A' of FIG. 1A.
Figure 1C:
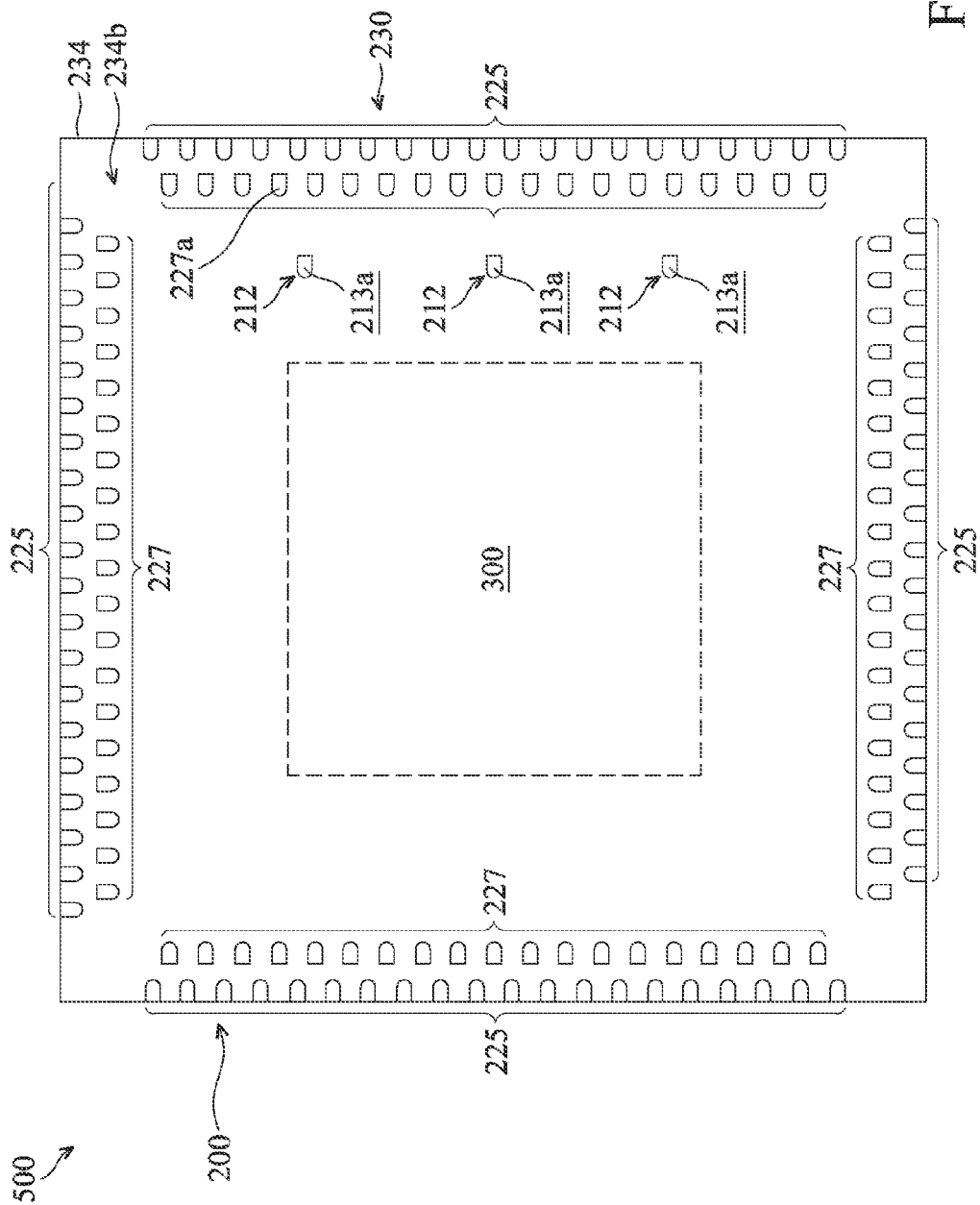
FIG. 1C is a bottom view of a semiconductor package in accordance with some embodiments of the disclosure.

FIG. 1A is a top view of a semiconductor package 500 in accordance with some embodiments of the disclosure. FIG. 1B is a cross-sectional view taken along the line A-A' of FIG. 1A. FIG. 1C is a bottom view of a semiconductor package 500 in accordance with some embodiments of the disclosure. For clearly illustrating the arrangement inside the semiconductor package, a boundary of a molding material 234 for encapsulation is merely illustrated. Further, bonding wire 304a and 304b as shown in FIG. 1B is not shown in FIG. 1A for clearly illustrating the arrangement inside the semiconductor package in the top view.

In some embodiments, the semiconductor package 500 may include a lead frame package, for example, a quad-flat-no-leads package (QFN), an advanced QFN (aQFN) package, s low-profile quad flat package (LQFP), a dual-flat-no-lead package (DFN), a quad-flat package (QFP) or a dual-in-line package (DIP) or the like. As illustrated in FIGS. 1A-1C, the semiconductor package 500 includes a lead frame 200, a semiconductor die 300 and a molding material 234. In some embodiments, the lead frame 200 includes a die paddle 202, supporting bar 232, leads 230, and a power bar 208. In some embodiments, the lead frame 200 is formed of metal materials, for example, copper or an alloy thereof.

As illustrated in FIGS. 1A-1C, the die paddle 202 is disposed in a central portion of the lead frame 200, electrically connected to the supporting bars 232. In some embodiments, the die paddle 202 includes a die attached surface 202a and a substrate attached surface 202b opposite to the die attached surface 202a. The die attached surface 202a of the die paddle 202 is configured to provide the semiconductor die 300 mounted thereon. The substrate attached surface 202b of the die paddle 202 is configured to provide a substrate or base (not shown) attachment.

The supporting bar 232 connects to the die paddle 202 to support the die paddle 202. As illustrated in FIG. 1A, the supporting bar 232 extends in an outward direction from corners of the die paddle 202. In some embodiments, the supporting bar 232 has a ground ring section 204 connect to corners of the die paddle 202 through several connection portions 206. The ground ring section 204 surrounds the corresponding edge of the die paddle 202, separating from the die paddle 202 through the connection portions 206 as shown in FIGS. 1A and 1B. In some embodiments, the ground ring section 204 is configured to be electrically connected to ground pads of the semiconductor die 300. Therefore, the die paddle 202 can serve as a ground plane for the semiconductor die 300.

A plurality of discrete leads 230 is disposed to be separated from the die paddle 202 and the supporting bar 232. The leads 230 are arranged along the corresponding edge of the die paddle 202. Also, the leads 230 extend in an outward direction from the die paddle 202. In some embodiments, the leads 230 include power leads, ground leads and signal leads. For example, the leads 230 include at least three power leads 216, 218 and 226, and at least three ground leads 220, 222 and 224 disposed beside the power leads as shown in FIG. 1A. The power leads, ground leads and signal leads are designed to be electrically connected to corresponding power pads, ground pads and signal pads of the semiconductor die 300 through bonding wires, respectively. For example as shown in FIG. 1B, a power pad 302a of the semiconductor die 300 is electrically connected to a top surface 229 of a corresponding power lead 226 through a bonding wire 304a. A ground pad 302b of the semiconductor die 300 is electrically connected to a top surface 223 of a corresponding ground lead 224 through a bonding wire 304b. It should be noted that the number of leads 230 is dependent upon design requirements, and is not limited.

As shown in FIGS. 1A and 1B, it should be noted that some of the ground leads, for example, the ground leads 220, 222 and 224 may be designed to be in contact with the ground ring section 204 in accordance with some embodiments of the disclosure. Therefore, a portion the ground ring section 204 directly connecting to the corresponding ground leads, for example, the ground lead 224, may collectively form a continuous routing in a top view as shown in FIG. 1A and in a cross-sectional view of the semiconductor 500 as shown in FIG. 1B. The continuous routing formed by the ground ring section and the ground lead may have the ground isolation and radio-frequency (RF) shielding function for other signal leads (not shown) of the lead frame 200.

In some embodiments as shown in FIGS. 1A and 1B, each of the leads 230 has a first terminal close to the die paddle 202 and a second terminal away from the die paddle 202 and opposite to the first terminal. For example as shown in FIG. 1B, the power lead 226 has a first terminal 226-1 close to the die paddle 202 and a second terminal 226-2 extending outward from the die paddle 202. Similarly, the ground lead 224 has a first terminal 224-1 close to the die paddle 202 and a second terminal 224-2 extending outward from the die paddle 202. Each of the leads 230 has a bonding region close to the second terminal, such that the semiconductor package 500 may be mounted on a substrate, for example, a printed circuit board (PCB), through the bonding region. For example as shown in FIG. 1B, the power lead 226 has a bonding region 227 close to the second terminal 226-2 thereof. Similarly, the ground lead 224 has a bonding region 225 close to the second terminal 224-2 thereof. It should be noted that the bonding regions of leads 230 have a thickness thicker than the thickness of the first terminals of the leads 230 in a cross-sectional view as shown in FIG. 1B. For example, the first terminal 226-1 of the power lead 226 has a thickness T1, the bonding region 227 of the power lead 226 has a thickness T2. The first terminal 224-1 of the ground lead 224 has the thickness T1, the bonding region 225 of the ground lead 224 has the thickness T2. Similarly, first terminals 216-1 and 218-1 of the power leads 216 and 218 have the thickness T1. In some embodiments, the thickness T1 is designed to be less than the thickness T2 by a half-etching process for the lead frame fabrication, such that the bonding region 227 electrically connected to the substrate is well defined. As shown in FIG. 1B, a bottom surface 228 of the first terminal 226-1 of the power lead 226 is recess from a bottom surface 227a of the bonding region 227. A bottom surface 205 of the first terminal 224-1 of the ground lead 224 is recess from a bottom surface 225a of the bonding region 225.

In some embodiments as shown in FIGS. 1A-1C, the lead frame 200 further includes a power bar 208. The power bar 208 is disposed between the die paddle 202 and the leads 230. The power bar 208 extends in a direction substantially along a corresponding edge 202c, for example, of the die paddle 202. In some embodiments, the power bar 208 is configured to connect to the at least two power leads, for example, the power leads 216 and 218. The power bar 208 may provide the same voltage for the power pads of the semiconductor die 300, which are electrically connected to the power leads 216 and 218 of the lead frame 200. Therefore, the power bar 208 is free from contact with any ground leads, for example, the ground leads 220, 222 and 224. As shown in FIG. 1A, the power bar 208 has terminal portions 210a and 210b to be in contact with the first terminals 216-1 and 218-1 of the power leads 216 and 218, respectively. Therefore, the power bar 208 and the power leads 216 and 218 connecting thereto may collectively construct a continuous routing. A thickness of the terminal portions 210a and 210b may be designed to be substantially equal to the thickness of the first terminals of the leads 230. For example, the thickness of the terminal portions 210a and 210b is substantially equal to the thickness T1 of the first terminals 216-1 and 218-1 of the power leads 216 and 218.

In some embodiments as shown in FIGS. 1A-1C, the power bar 208 includes a supporting portion 212 to be positioned between the terminal portions 210a and 210b to improve the mechanical strength of the power bar 208. The supporting portion 212 is free from contact with any of the power leads 216 and 218. In some embodiments, the thickness of the supporting portion 212 of the power bar 208 may be designed to be substantially equal to the thickness of the bonding region of the leads 230. For example, the thickness of supporting portion 212 is substantially equal to the thickness T2 of the bonding region 227 of the power lead 226 and the bonding region 225 of the ground lead 224. Additionally, the thickness T2 of the supporting portion 212 is designed to be greater than the thickness (T1) of the terminal portions 210a and 210b of the power bar 208. In some embodiments, the thickness of the supporting portion 212 is designed to be greater than that of the first terminals of the leads 230. For example, the thickness T2 of supporting portion 212 is greater than the thickness T1 of the first terminal 224-1 of the ground lead 224 and the first terminals 216-1, 218-1, 226-1 of the power leads 216, 218, 226.

In some embodiments as shown in FIGS. 1A-1C, the molding material 234 encapsulates the lead frame 200, the semiconductor die 300 and the bonding wires 304a and 304b. The molding material 234 has a top surface 234a and a bottom surface 234b opposite to the top surface 234a. In some embodiments, the molding material 234 may be formed of molding materials such as resin. As shown in FIGS. 1B-1C, the molding material 234 is formed leaving the bonding regions of the leads 230 and the supporting portion of the power bar 208 exposed. More specifically, the molding material 234 wraps a top surface 214 of the power bar 208, leaving a bottom surface 213a of the supporting portion 212 exposed from the bottom surface 234b of the molding material 234. The molding material 234 also wraps top surfaces 223 and 229 of the ground lead 224 and power lead 226, leaving a bottom surface 227a of the bonding region 227 and a bottom surface 225a of the bonding region 225 exposed from the bottom surface 234b of the molding material 234. In some embodiments, the bottom surfaces of the bonding regions 225 and 227 of the leads 230 (including the bottom surface 227a of the bonding region 227 and a bottom surface 225a of the bonding region 225) and the bottom surfaces 213a of the supporting portion 212 of the power bar 208 are exposed from the bottom surface 234b of the molding material 234 in a bottom view of the semiconductor package 500 as shown in FIG. 1C. In some embodiments, the bottom surface of the supporting portion 212 is aligned to the bottom surfaces of the bonding regions of the leads 230. For example, the bottom surface 213a of the supporting portion 212 is aligned to the bottom surface 227a of the bonding region 227 and the bottom surface 225a of the bonding region 225 as shown in FIG. 1B.

In some embodiments as shown in FIGS. 1B-1C, the supporting portion 212 having the bottom surface 213a exposed from the molding material 234 may serve as an additional bonding region of the lead frame 200. Therefore, the substrate for the semiconductor package 500 mounted thereon may have design flexibility for the power pad positions.

Embodiments provide a lead frame design for a semiconductor package. The lead frame includes a power bar connecting at least two power leads to provide the same voltage for a semiconductor die mounted thereon. The power bar is designed to have at least one supporting portion with a thickness comparable to the thickness of bonding region of power leads. Therefore, bottom surfaces of bonding regions of the power leads and a bottom surface of the supporting portion of the power bar can be exposed from a molding material. The supporting portion with a thick thickness can improve the mechanical strength of the power bar. Therefore, the power bar can be free from contact with additional dummy leads to avoid the problem of dangling. Also, the supporting portion exposed from the molding material may serve as an additional bonding region of the lead frame to increase design flexibility for the power pad positions.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
  a lead frame, comprising:
    a die paddle;
    a supporting bar connecting to the die paddle, extending in an outward direction from the die paddle;
    at least two power leads separated from the die paddle and the supporting bar, having first terminals close to the die paddle and second terminals extending outward from the die paddle; and
    a power bar connecting to the at least two power leads, having a supporting portion; and
  a molding material encapsulating the lead frame leaving the supporting portion exposed;
  wherein the power bar is disposed between the die paddle and the at least two power leads, extending in a direction substantially along a corresponding edge of the die paddle.

2. The semiconductor package as claimed in claim 1, wherein each of the at least two power leads has a bonding region close to the second terminal, exposed from the molding material.

3. The semiconductor package as claimed in claim 2, wherein a surface of the supporting portion exposed from the molding material is coplanar to the bonding region of the second terminal.

4. The semiconductor package as claimed in claim 1, wherein the power bar has a terminal portion in contact with the first terminal of one of the at least two power leads, wherein a thickness of the supporting portion is greater than that of a terminal portion.

5. The semiconductor package as claimed in claim 1, wherein the supporting portion is free from contact with any of the at least two power leads.

6. The semiconductor package as claimed in claim 1, wherein the power bar is free from contact with any ground leads.

7. The semiconductor package as claimed in claim 1, wherein a thickness of the supporting portion is greater than that of the first terminals.

8. The semiconductor package as claimed in claim 1, wherein the supporting bar has a ground ring section surrounding the corresponding edge of the paddle.

9. The semiconductor package as claimed in claim 5, wherein the ground ring section is in contact with a ground lead disposed beside the at least two power leads.

10. A semiconductor package, comprising:
  a lead frame, comprising:
    a die paddle;
    a supporting bar electrically connected to the die paddle, extending in an outward direction from the die paddle;
    at least two power leads separated from the die paddle and the supporting bar, having first terminals close to the die paddle and second terminals extending outward from the die paddle; and
    a power bar connecting to the at least two power leads, wherein the power bar comprises a supporting portion, a thickness of a supporting portion of the power bar is greater than that of the first terminals;
  wherein the power bar is disposed between the die paddle and the at least two power leads, extending in a direction substantially along a corresponding edge of the die paddle.

11. The semiconductor package as claimed in claim 10, further comprising:
  a molding material encapsulating the lead frame leaving the supporting portion exposed.

12. The semiconductor package as claimed in claim 11, wherein each of the at least two power leads has a bonding region close to the second terminal, exposed from the molding material.

13. The semiconductor package as claimed in claim 12, wherein a surface of the supporting portion exposed from the molding material is coplanar to the bonding region of the second terminal.

14. The semiconductor package as claimed in claim 10, wherein the power bar has a terminal portion in contact with the first terminal of one of the at least two power leads, wherein a thickness of the supporting portion is greater than that of a terminal portion.

15. The semiconductor package as claimed in claim 10, wherein the supporting portion is free from contact with any of the at least two power leads.

16. The semiconductor package as claimed in claim 10, wherein the power bar is free from contact with any ground leads.

17. The semiconductor package as claimed in claim 10, wherein the supporting bar has a ground ring section surrounding a corresponding edge of the die paddle.

18. The semiconductor package as claimed in claim 17, wherein the ground ring section is in contact with a ground lead disposed beside the at least two power leads.

19. A semiconductor package, comprising:
a lead frame, comprising:
a die paddle;
a supporting bar electrically connected to the die paddle, extending in an outward direction from the die paddle;
at least two power leads separated from the die paddle and the supporting bar; and
a power bar having a terminal portion in contact with the first terminal of one of the at least two power leads and a supporting portion that is free from in contact with any of the at least two power leads, wherein a thickness of the supporting portion is greater than that of a terminal portion;
wherein the power bar is disposed between the die paddle and the at least two power leads, extending in a direction substantially along a corresponding edge of the die paddle.

20. The semiconductor package as claimed in claim 19, further comprising:
a molding material encapsulating the lead frame leaving the supporting portion exposed.

21. The semiconductor package as claimed in claim 20, wherein the at least two power leads has first terminals close to the die paddle and second terminals extending outward from the die paddle.

22. The semiconductor package as claimed in claim 21, wherein each of the at least two power leads has a bonding region close to the second terminal, exposed from the molding material.

23. The semiconductor package as claimed in claim 22, wherein a surface of the supporting portion exposed from the molding material is coplanar to the bonding region of the second terminal.

24. The semiconductor package as claimed in claim 19, wherein the power bar is free from contact with any ground leads.

25. The semiconductor package as claimed in claim 21, wherein a thickness of the second terminals is greater than that of the first terminals.

26. The semiconductor package as claimed in claim 19, wherein the supporting bar has a ground ring section surrounding a corresponding edge of the die paddle.

27. The semiconductor package as claimed in claim 26, wherein the ground ring section is in contact with a ground lead disposed beside the at least two power leads.

* * * * *